(12) United States Patent
Bergendahl et al.

(10) Patent No.: US 9,331,073 B2
(45) Date of Patent: May 3, 2016

(54) EPITAXIALLY GROWN QUANTUM WELL FINFETS FOR ENHANCED PFET PERFORMANCE

(71) Applicant: International Business Machines Corporation, Armonk, NY (US)

(72) Inventors: Marc A. Bergendahl, Troy, NY (US); James J. Demarest, Rensselaer, NY (US); Hong He, Schenectady, NY (US); Seth L. Knupp, Schenectady, NY (US); Raghavasimhan Sreenivasan, Schenectady, NY (US); Sean Teehan, Rensselaer, NY (US); Allan W. Upham, Waterford, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/497,380

(22) Filed: Sep. 26, 2014

(65) Prior Publication Data

US 2016/0093613 A1 Mar. 31, 2016

(51) Int. Cl.
*H01L 27/088* (2006.01)
*H01L 29/78* (2006.01)
*H01L 29/04* (2006.01)
*H01L 29/12* (2006.01)
*H01L 29/06* (2006.01)
*H01L 21/8234* (2006.01)
*H01L 29/66* (2006.01)
*H01L 21/02* (2006.01)
*H01L 21/762* (2006.01)

(52) U.S. Cl.
CPC ........ *H01L 27/0886* (2013.01); *H01L 21/0217* (2013.01); *H01L 21/02164* (2013.01); *H01L 21/02535* (2013.01); *H01L 21/02592* (2013.01); *H01L 21/76224* (2013.01); *H01L 21/823431* (2013.01); *H01L 29/045* (2013.01); *H01L 29/0653* (2013.01); *H01L 29/122* (2013.01); *H01L 29/6656* (2013.01); *H01L 29/66795* (2013.01); *H01L 29/7851* (2013.01)

(58) Field of Classification Search
CPC ............ H01L 29/785; H01L 29/66795; H01L 29/045; H01L 21/845; H01L 27/1211
See application file for complete search history.

(56) References Cited

U.S. PATENT DOCUMENTS

| | | |
|---|---|---|
| 7,145,167 B1 | 12/2006 | Chu |
| 7,928,426 B2 | 4/2011 | Chui et al. |
| 8,217,383 B2 | 7/2012 | Hudait et al. |
| 8,283,653 B2 | 10/2012 | Pillarisetty et al. |
| 8,497,177 B1 | 7/2013 | Chang et al. |
| 8,575,653 B2 | 11/2013 | Rachmady et al. |

(Continued)

OTHER PUBLICATIONS

Linten et al., "ESD performance of High Mobility SiGe Quantum Well Bulk FinFET Diodes and pMOS Devices", 35th Electrical Overstress/Electrostatic Discharge Symposium (EOS/ESD), 2013, 8 pages.

(Continued)

*Primary Examiner* — Tony Tran
(74) *Attorney, Agent, or Firm* — David Zwick; Steven Meyers

(57) ABSTRACT

A method of forming a quantum well having a conformal epitaxial well on a {100} crystallographic orientated fin. The method may include: forming fins in a {100} crystallographic oriented substrate; forming a conformal well on the fins using epitaxial growth; and forming a conformal barrier on the conformal well using epitaxial growth.

10 Claims, 4 Drawing Sheets

(56) References Cited

U.S. PATENT DOCUMENTS

2007/0063276 A1* 3/2007 Beintner ............... H01L 21/845
        257/347
2014/0054547 A1  2/2014 Eneman et al.
2015/0093891 A1* 4/2015 Zope .................... H01L 21/768
        438/618

OTHER PUBLICATIONS

Togo et al., "Phosphorus Doped SiC Source Drain and SiGe Channel for Scaled Bulk FinFETs", IEEE International Electron Devices Meeting (IEDM), 2012, pp. 18.2.1-18.2.4.

Xu et al., "MuGFET Carrier Mobility and Velocity: Impacts of Fin Aspect Ratio, Orientation and Stress", IEEE International Electron Devices Meeting (IEDM), 2010, pp. 8.5.1-8.5.4.

Hellings et al., "High Mobility and Quantum Well Transistors", Design and TCAD Simulation, http://www.springer.com/us/book/9789400763395, pp. 1-8, Printed on Aug. 6, 2015.

IBM: List of IBM Patents or Patent Applications Treated As Related (Appendix P), Oct. 5, 2015, 2 pages.

Pending U.S. Appl. No. 14/874,505, filed Oct. 5, 2015, entitled: "Epitaxially Grown Quantum Well FinFETs for Enhanced pFET Performance", 17 pages.

* cited by examiner

SECTION VIEW A

SECTION VIEW A

EPITAXIALLY GROWN QUANTUM WELL FINFETS FOR ENHANCED PFET PERFORMANCE

BACKGROUND

The present invention generally relates to the formation of fin field effect transistors (finFET's) in a {100} crystallographic oriented silicon substrate, and more particularly the formation of a quantum well having a conformal epitaxial well on a fin in the {100} crystallographic orientation to increase pFET (hole) mobility while having a negligible impact on nFET (electron) mobility.

In each new generation of semiconductor technology, transistor current decreases due to gate width reduction, mobility degradation of minority carriers and reduction of supply voltage. Reduced transistor current results in deterioration of circuit stability and reduces the speed of circuit operation thereby causing degradation in performance. One of the key parameters determining the mobility of minority carriers is the crystallographic surface orientation on which the channel of the transistor is built. Therefore, the crystallographic orientation of the surface, or the surface orientation of a transistor structure plays a key role in determining the performance of the transistor.

Specifically, the nFET mobility in silicon is high in the {100} crystallographic orientation and significantly decreased in the {110} crystallographic orientation, while the pFET mobility is high in the {110} crystallographic orientation and decreased in the {100} crystallographic orientation of single silicon crystal.

SUMMARY

According to one embodiment of the present invention, a method is provided. The method may include forming a pad layer on a {100} crystallographic oriented substrate; forming a mandrel on the pad layer; forming spacers on sidewalls of the mandrel; forming a spacer pattern by removing the mandrel from in-between the spacers; forming fins in the substrate by transferring the spacer pattern into the substrate; forming a recessed oxide fill on the substrate and in-between the fins, a top surface of the recessed oxide fill is below a top surface of the fins; forming a conformal well on the fins using epitaxial growth; and forming a conformal barrier on the conformal well using epitaxial growth, wherein the conformal well is in-between the fins and the conformal barrier, the conformal well has a lower band-gap than the conformal barrier and the fins.

According to another embodiment of the present invention, a method is provided. The method may include forming fins in a {100} crystallographic oriented substrate; forming a conformal well on the fins using epitaxial growth; and forming a conformal barrier on the conformal well using epitaxial growth.

According to another embodiment of the present invention, a structure is provided. The structure may include a fin having a {100} crystallographic orientation; a conformal well covering the fin; and a conformal barrier covering the conformal well.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
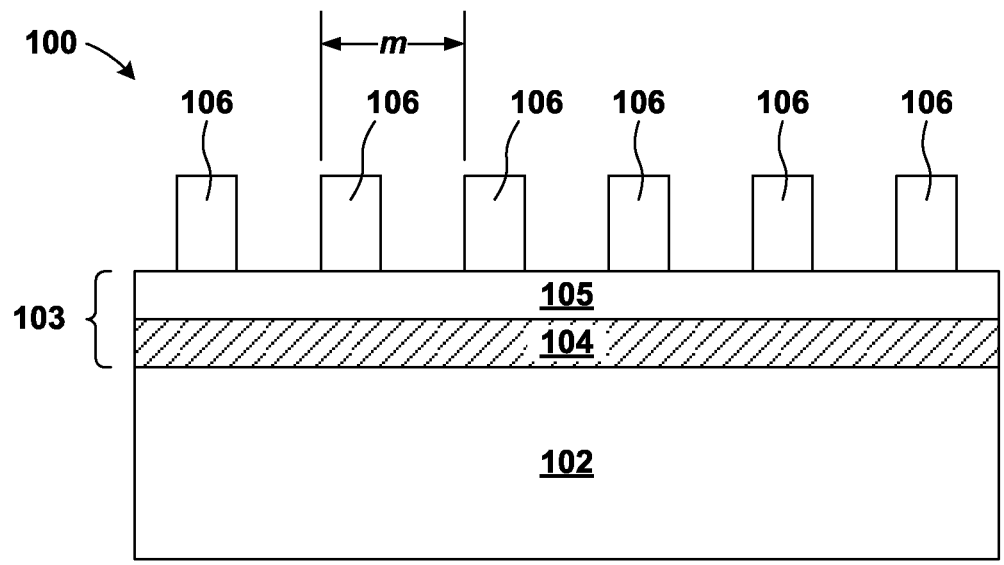
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to the formation of fin field effect transistors (finFET's) in a {100} crystallographic oriented silicon substrate, and more particularly the formation of a quantum well having a conformal epitaxial well on a fin in the {100} crystallographic orientation to increase pFET (hole) mobility while having a negligible impact on nFET (electron) mobility. The purpose of the quantum well is to increase device performance via confinement of charge carriers within an active region, which ultimately reduces recombination across a fin width. One embodiment by which to form a conformal well on fins in the {100} crystallographic orientation is described in detail below with reference to the accompanying drawings FIGS. 1-8.

A quantum well is a thin film (well) sandwiched between two barrier layer materials, the barrier layer materials have a wider band-gap than the well. This creates discrete energy levels between the barrier layers and the well and results in quantum confinement of energy carriers (electrons and holes). The band-gap offset between the well and barrier materials can be varied by changing material systems and/or doping content. It is known that nFET and pFET fins would require varied band-gap offsets within the quantum well to optimize performance because electron mobility is roughly three times that of holes. Thus an additional embodiment of this invention may allow for the variation of well and/or barrier layer material systems in order to optimize nFET or pFET performance.

FIGS. 1-5 are demonstrative illustrations of a structure 100 during an intermediate step of a method of fabricating a quantum well having a conformal well on a fin in a {100} crystallographic orientation. More specifically, the method can start with forming fins 109 in a substrate 102. It should be noted, any method of forming fins may be used. FIGS. 1-4 illustrate the implementation of a sidewall image transfer (SIT) technique according to an exemplary embodiment.

The SIT technique involves the usage of a sacrificial structure (e.g., a mandrel). A spacer is formed on the sidewalls of the mandrel. The spacers generally have a thickness of about 15 nm. The mandrel is removed and the spacers are used as a mask to etch lower layers (i.e., to form device components such as fins) using techniques such as reactive ion etching (RIE). A SIT process may be preferred in the present invention because it may be desirable to reduce the fin thickness by reducing the spacer thickness. A thinner fin may allow for the growth of a well on the fin while maintaining a currently used fin pitch.

With reference to FIG. 1, the method may include fabricating a mandrel 106 on a pad layer 103, where the pad layer 103 is on a substrate 102. In the exemplary embodiment, the pad layer 103 includes an oxide layer 105 on a nitride layer 104. The substrate 102 may include; a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In the exemplary embodiment, the substrate 102 is a bulk silicon substrate.

In the exemplary embodiment, the nitride layer 104 may be formed on the substrate 102 using any deposition technique known in the art, such as, for example, chemical vapor deposition (CVD), plasma enhanced chemical vapor deposition (PECVD), atomic layer deposition (ALD), or physical vapor deposition (PVD). The nitride layer 104 may be any pad material known in the art, such as, for example, oxides, nitrides, or oxynitrides. In an embodiment, the nitride layer 104 may be, for example, $Si_3N_4$. The nitride layer 104 may have a thickness of, for example, about 40 nm.

In the exemplary embodiment, the oxide layer 105 may be formed on the nitride layer 104 using any deposition technique known in the art, such as, for example, chemical vapor deposition (CVD), plasma enhanced chemical vapor deposition (PECVD), atomic layer deposition (ALD), or physical vapor deposition (PVD). The oxide layer 105 may be any pad material known in the art, such as, for example, oxides, nitrides, or oxynitrides. In an embodiment, the oxide layer 105 may be, for example, undoped silicon glass (USG). An oxide may be preferable because of the selectivity of oxide to nitride subsequent etching steps. The oxide layer 105 may have a thickness of, for example, about 30 nm.

In the exemplary embodiment, the mandrel 106 may be formed on the oxide layer 105 using any deposition and etching technique known in the art, such as, for example, depositing a silicon layer and a photoresist on a pad layer, patterning the photoresist, and transferring the photoresist pattern into the silicon layer. The mandrel 106 may be any mandrel material known in the art, such as, for example, amorphous silicon or amorphous carbon. In an embodiment, the mandrel 106 may be amorphous silicon. The mandrel 106 may have a thickness (height) of, for example, about 100 nm. The mandrel 106 may have a pitch (m) between two mandrels. The pitch (m) may be, for example, about 84 nm.

Figure 2:
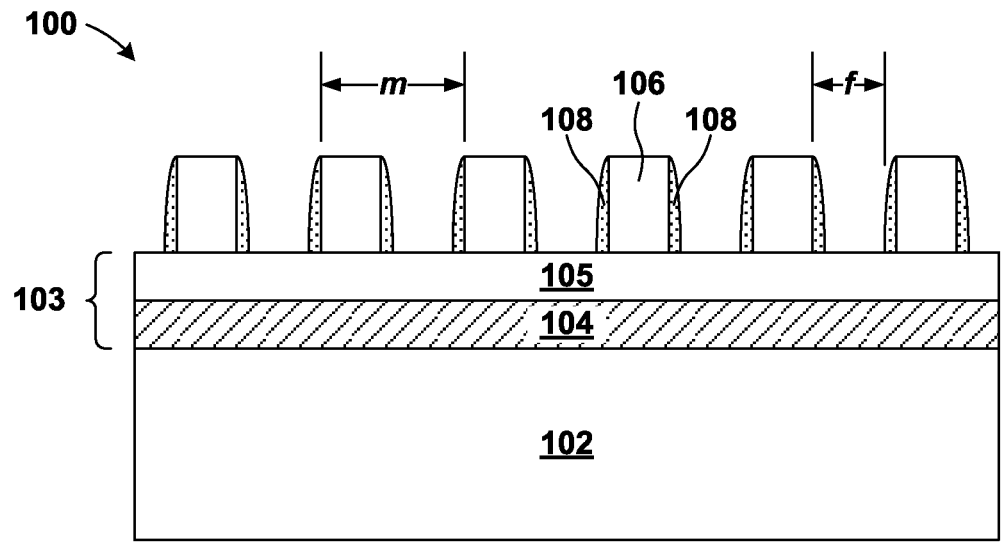
FIG. 2 is a cross section view of the semiconductor structure and illustrates the formation of spacers on a mandrel, according to an exemplary embodiment.

With reference to FIG. 2, the method can include fabricating spacers 108 on sidewalls of the mandrel 106. The spacers 108 may be formed using any spacer formation technique known in the art, such as, for example, conformally depositing a spacer layer on a structure and removing the spacer layer from horizontal surfaces using a directional etch. The spacers 108 may be any spacer material known in the art, such as, for example, oxides, nitrides, or oxynitrides. In an embodiment, the spacers 108 may be $Si_3N_4$. During the directional etching step of the spacers 108, the oxide layer 105 may be used as an etch stop. The oxide layer 105 may be a good etch stop because of the selectivity between the exemplary materials used, i.e. $Si_3N_4$ and USG. The spacers 108 may be used in subsequent steps to form device components (e.g., a spacer is used to form a fin).

It may be preferable to have spacers 108 that are thinner than typical SIT spacers used in the art. A thinner spacer 108 may be used to subsequently form thinner fins 109, which may be beneficial when growing layers on the fins 109 to maintain a typical fin pitch. Typically the spacer layer (and subsequently formed spacers) may have a thickness of about 15 nm, but in the exemplary embodiment, the thickness of the spacers 108 may be, for example, about 8 nm. This may subsequently create thinner fins 109 and allow for the formation of a conformal well on the fins 109 while maintaining a similar pitch to a typical fin pitch used in the art. The spacers 108 may have a pitch (f) between two spacers 108 and subsequently between two fins 109. The pitch (f) may be, for example, about 42 nm. It should be noted, one or more spacers 108 may be implemented to form one or more fins 109.

Figure 3:
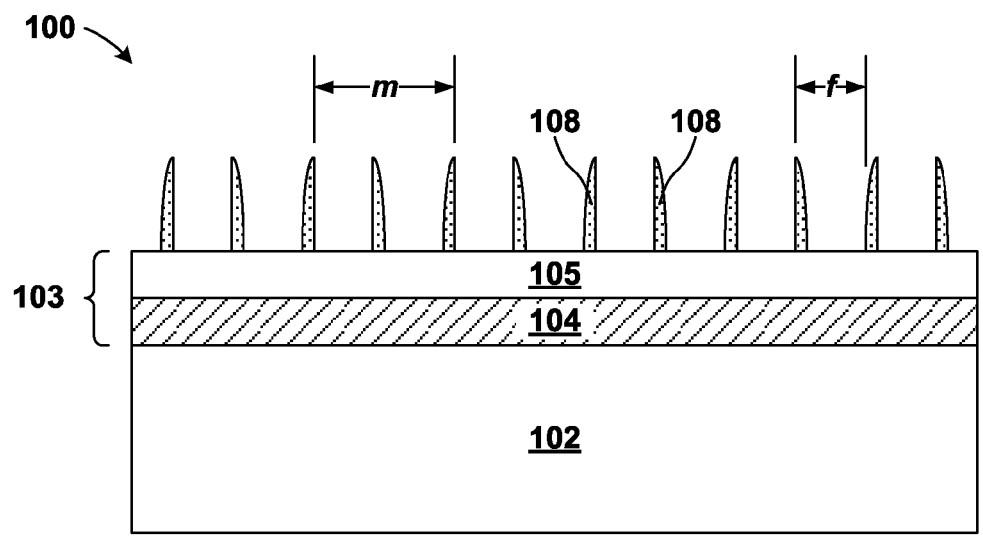
FIG. 3 is a cross section view of the semiconductor structure and illustrates the formation of a spacer pattern, according to an exemplary embodiment.

With reference to FIG. 3, the method can include removing the mandrel 106. The mandrel 106 may be removed using any etching technique know in the art, such as, for example, RIE. The etching technique may etch the mandrel 106 selective to the spacers 108 and to the oxide layer 105 (i.e., the etching technique etches the mandrel 106 and uses the spacers 108 and the oxide layer 105 as an etch stop). An alternative method may include depositing a protective material on the oxide layer 105 and etching the mandrel 106 selective to the spacers 108. Once the mandrel 106 is removed, the spacers 108 may form a spacer pattern. In the exemplary embodiment, the spacer pattern may be subsequently transferred into the substrate to form the fins 109 (illustrated in FIG. 5).

Figure 4:
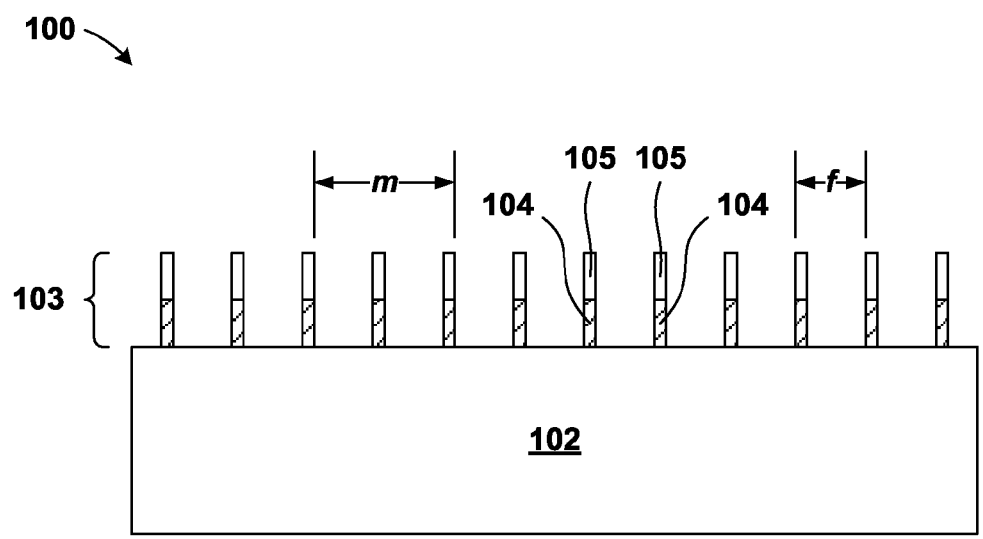
FIG. 4 is a cross section view of the semiconductor structure and illustrates the transfer of the spacer pattern into a pad layer, according to an exemplary embodiment.

With reference to FIG. 4, the method can include transferring the spacer pattern into the pad layer 103, factoring in changes, such as, for example, any etch film erosion. The spacer pattern may be transferred into the pad layer 103 using any etching technique known in the art, such as, for example, RIE. The spacer pattern may be transferred by etching the pad layer 103 and using the substrate 102 as an etch stop (i.e., etching the pad layer selective to the substrate 102). In the exemplary embodiment, the spacer pattern may be transferred into the oxide layer 105 first by etching the oxide layer 105 and using the spacers 108 and the nitride layer 104 as an etch stop. Next, the spacer pattern may be transferred into the nitride layer 104 by etching the nitride layer 104 while using the patterned oxide layer 105 and the substrate 102 as an etch stop. In the exemplary embodiment, the spacers 108 may be simultaneously removed during the transferring of the spacer pattern into the nitride layer 104 because the spacers 108 and the nitride layer 104 are both nitrides. The exemplary embodiment may be preferable because the similar materials used for the spacers 108 and the nitride layer 104 may allow for simultaneous removal of the spacers 108 and patterning of the nitride layer 104 and/or providing an etch budget during the removal of the spacers 108 (i.e., prevent or control over etching of the substrate 102 during the removal of the spacers 108). An optional step may be used to remove the spacers 108 in a separate step from the transfer of the spacer pattern into the nitride layer 104.

Figure 5:
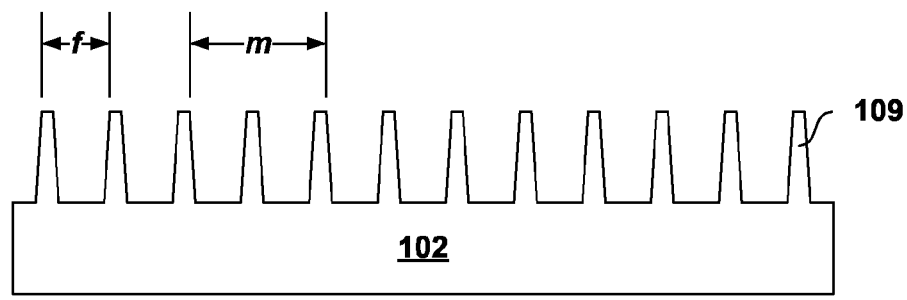
FIG. 5 is a cross section view of the semiconductor structure and illustrates the formation of fins by transferring the spacer pattern into a substrate, according to an exemplary embodiment.

With reference to FIG. 5, the method can include the formation of the fins 109 in the substrate 102. The fins 109 may be formed by transferring the spacer pattern into the substrate 102, factoring in changes, such as, for example, any etch film erosion. The spacer pattern may be transferred into the substrate 102 using any etching technique known in the art, such as, for example, RIE. The fins 109 may have a similar thickness (width) as the spacers 108 used to form the fins 109. In the exemplary embodiment, a spacer thickness and a fin thickness are both, for example, about 8 nm, factoring in changes, such as, for example, any etch film erosion. The pitch (f) between the fins 109 may be similar to the pitch (f) between the spacers 108 as is known in the art.

Figure 6:
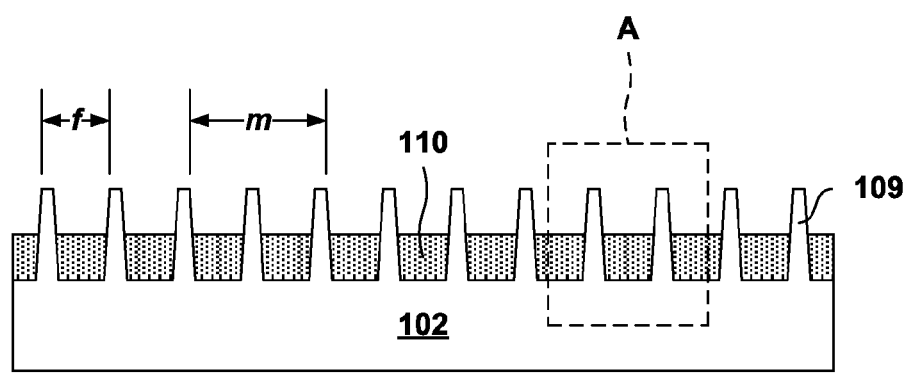
FIG. 6 is a cross section view of the semiconductor structure and illustrates a recessed oxide fill in-between the fins, according to an exemplary embodiment.

FIG. 6 is a demonstrative illustration of the structure 100 during an intermediate step of a method of fabricating a quantum well having a conformal well on a fin in a {100} crystallographic orientation. More specifically, the method may include forming and recessing an oxide fill 110 between the fins 109.

The oxide fill 110 may be deposited on, and between, the fins 109 using any deposition method known in the art, such as, for example, chemical vapor deposition (CVD), plasma enhanced chemical vapor deposition (PECVD), atomic layer deposition (ALD), or physical vapor deposition (PVD). The oxide fill 110 may be any isolating material, such as, for example, oxide, nitride, or oxynitrides. The oxide fill 110 may then be recessed below a top surface of the fins 109 to act as a base isolation between the fins 109 and other fins, components or devices. In an embodiment, the oxide fill 110 may be silicon dioxide ($SiO_2$) which is deposited on, and in-between, the fins 109 and then etched back to expose a portion of the fins 109. The exposed portion of the fins 109 may define a baseline height of the fins 109. The baseline height of the fins 109 may be the distance from a top surface of the oxide fill 110 to the top surface of the fins 109. The oxide fill 110 may be more accurate or controllable in forming the baseline height of the fins 109 than attempting to control a height of the fins 109 during fin formation (i.e., the spacer pattern transfer from the pad layer 103 into the substrate 102).

Figure 7:
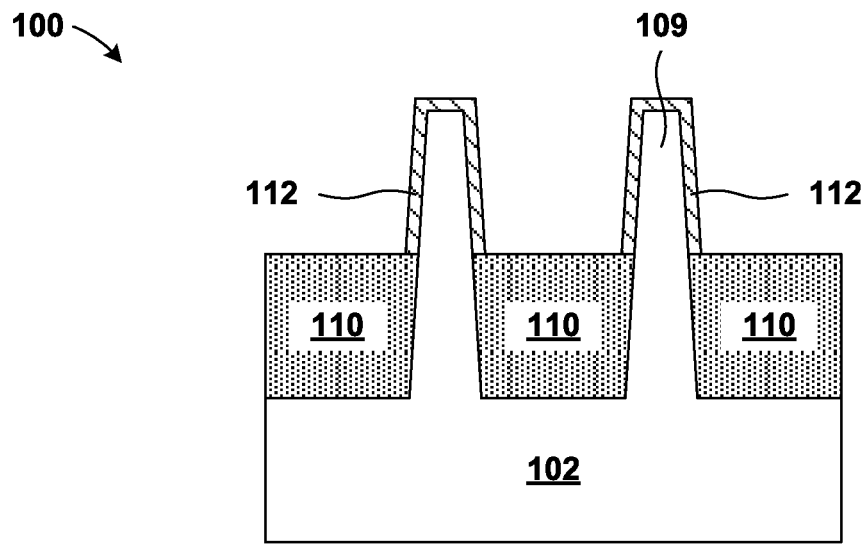
FIG. 7 is a section view of the semiconductor structure illustrated in FIG. 6 taken along section view A and illustrates the subsequent formation of a quantum well using conformal epitaxial growth, according to an exemplary embodiment.
Figure 8:
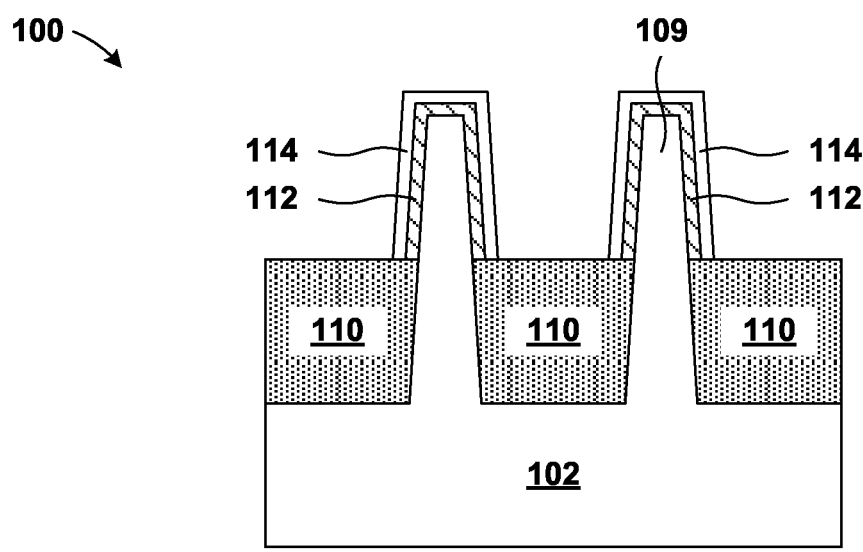
FIG. 8 is a section view of the semiconductor structure illustrated in FIG. 6 taken along section view A and illustrates the subsequent formation of a barrier on the quantum well using conformal epitaxial growth, according to an exemplary embodiment.

FIGS. 7 and 8 are demonstrative illustrations of a structure 100 during an intermediate step of a method of fabricating a quantum well having a conformal well on a fin in a {100} crystallographic orientation. More specifically, the method may include using conformal epitaxial growth to grow a well 112 on the fins 109 and enclosing the well 112 with a barrier layer 114. Because the present embodiment is utilizing the {100} crystallographic fin orientation, epitaxial growth will be conformal rather than diamond shaped, as is typical in a {110} crystallographic fin orientation. FIGS. 7 and 8 are subsequent section views of the structure 100 illustrated in FIG. 6 taken along section view A. It should be noted that the well 112 is illustrated on multiple fins 109, however, the well 112 may be grown on any number of fins, including a single fin.

An epitaxial layer may be a layer of monocrystalline semiconductor material which grows outward from an exposed surface of an existing monocrystalline semiconductor region or layer. The epitaxial layer may have the same composition as the semiconductor region on which it is grown (e.g., the semiconductor material), the same impurities (e.g., dopants and their concentrations), or, alternatively, the compositions of the epitaxial layer and the underlying semiconductor region can be different. Sometimes, the epitaxial layer has characteristics that allow the epitaxial layer to impart a stress to the semiconductor region on which it is grown. For example, an epitaxial layer can impart a stress to an adjoining semiconductor region when the epitaxial layer includes a semiconductor alloy material different from the adjoining semiconductor region. The stress may be caused where the epitaxial layer has a different crystal lattice constant than the adjoining semiconductor region lattice constant. Epitaxial films are typically defect-free compared to other deposition methods.

The quantum well may include the well 112 sandwiched between the fins 109 and the barrier layer 114. The well 112 may grow conformally on the exposed surface of the fins 109. The {100} crystallographic orientation of the fins 109 allows for conformal epitaxial growth unlike epitaxial growth on a fin in the {110} crystallographic orientation. Epitaxial growth on a fin in the {100} crystallographic orientation will typically result in a diamond shape. In the exemplary embodiment, the chemistry and technique used to form the well 112 may be, for example, 650° C. deposition of a $SiH_4$ and $GeH_4$ precursor mixture at 10 mT followed by a bake at 790-850° C. The well 112 may be any conducting material known in the art having a smaller band-gap than the fins 109 and barrier layer 114. The band-gap offset of the well may range from, for example, 20 meV to 500 meV. In an embodiment, the well 112 may be silicon germanium (SiGe). The thickness (width) of the well 112 may be, for example, about 1.5 nm on each exposed surface of the fins 109, where an individual fin may have a portion of the well 112 on opposite sides, adding to a total of 3 nm laterally across each fin. The use of the quantum well may increase carrier density in active areas and may have a negligible effect on nFET mobility as is known in the art.

The barrier layer 114 may conformally grow on an exposed surface of the well 112. The barrier layer 114 may be grown on the well 112 by changing composition of the growth method. In an embodiment, the chemistry and technique used to form the barrier layer 114 may be, for example, 650° C. deposition of a $SiH_4$ and $GeH_4$ precursor mixture at 10 mT followed by a bake at 790-850° C. Additionally, a dual processing technique may be used to grow both the well 112 and the barrier layer 114. A dual processing epitaxy chamber may lower interface resistance and epitaxy defects due to less, or no, chamber breaks. The barrier layer 114 may be any material known in the art having a wider band-gap than the well 112. The band-gap offset of the barrier layer 114 may range from, for example, about 20 meV to 500 meV. The thickness of the barrier layer 114 may be, for example, about 2 nm on each exposed surface of the quantum well 112, where an individual fin may have a portion of the barrier layer 114 on opposite sides, totaling 3 nm across each fin. The exemplary embodiment may produce a quantum well fin with a thickness (width) of about 15 nm, which is the same as a typical fin currently used in the art. The quantum well fin may include the fin 109, the well 112, and the barrier layer 114. Additionally, because of the {100} crystallographic orientation of the fins 109 and the conformal growth of the well 112 and barrier layer 114, the pitch (f) may be similar to a typical, non-quantum well, fin. Subsequent formation steps may follow current finFET formation techniques, such as, for example, gate and cap formation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a pad layer on a {100} crystallographic oriented substrate;
   forming a mandrel on the pad layer, wherein the pad layer is an oxide layer on a nitride layer;
   forming spacers on sidewalls of the mandrel, wherein the spacers are silicon nitride;
   forming a spacer pattern by removing the mandrel from in-between the spacers;
   transferring the spacer pattern into the oxide layer using the nitride layer as an etch stop;
   transferring the spacer pattern into the nitride layer and simultaneously removing the spacers from above the oxide layer;
   forming fins in the substrate by transferring the spacer pattern in the nitride layer into the substrate;
   forming a recessed oxide fill on the substrate and in-between the fins, a top surface of the recessed oxide fill is below a top surface of the fins;
   forming a conformal well on the fins using epitaxial growth; and
   forming a conformal barrier on the conformal well using epitaxial growth, wherein the conformal well is in-between the fins and the conformal barrier, the conformal well has a lower band-gap than the conformal barrier and the fins;
   wherein the oxide layer is undoped silicon glass; and
   wherein the nitride layer is silicon nitride.

2. The method of claim 1, wherein a dual processing chamber is used to grow both the conformal well and the conformal barrier.

3. The method of claim 1, wherein the fins each have a thickness of 8 nm.

4. The method of claim 1, wherein the mandrel is amorphous silicon.

5. The method of claim 1, further comprising:
   forming an isolation region surrounding a set of fins, the isolation region is an electrical isolation between the set of fins and surrounding devices.

6. The method of claim 1, wherein the conformal well has a thickness of 1.5 nm and the conformal barrier has a thickness of 2 nm.

7. A method comprising:
   forming a nitride spacer pattern from a nitride spacer layer on a pad layer, wherein the pad layer is an oxide layer on a nitride layer;
   transferring the nitride spacer pattern into the oxide layer using the nitride layer as an etch stop;
   transferring the spacer pattern into the nitride layer and simultaneously removing the nitride spacer layer from above the oxide layer;
   forming fins in a {100} crystallographic oriented substrate by transferring the spacer pattern from the oxide layer into the {100} crystallographic oriented substrate;
   forming a conformal well on the fins using epitaxial growth; and
   forming a conformal barrier on the conformal well using epitaxial growth;
   wherein the conformal well and the conformal barrier are above a recessed oxide fill, the recessed oxide fill is in-between the fins, a top surface of the recessed oxide fill is below a top surface of the fins;
   wherein the oxide layer is undoped silicon glass; and
   wherein the nitride layer is silicon nitride.

8. The method of claim 7, wherein a dual processing chamber is used to grow both the conformal well and the conformal barrier.

9. The method of claim 7, wherein the fins each have a thickness of 8 nm.

10. The method of claim 7, wherein the conformal well has a thickness of 1.5 nm and the conformal barrier has a thickness of 2 nm.

* * * * *